(12) United States Patent
Pape

(10) Patent No.: US 10,707,110 B2
(45) Date of Patent: Jul. 7, 2020

(54) MATCHED TCR JOULE HEATER DESIGNS FOR ELECTROSTATIC CHUCKS

(71) Applicant: Lam Research Corporation, Fremont, CA (US)

(72) Inventor: Eric A. Pape, Campbell, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 322 days.

(21) Appl. No.: 15/292,688

(22) Filed: Oct. 13, 2016

(65) Prior Publication Data

US 2017/0148657 A1    May 25, 2017

Related U.S. Application Data

(60) Provisional application No. 62/258,825, filed on Nov. 23, 2015.

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01); *H01L 21/6831* (2013.01)

(58) Field of Classification Search
None
See application file for complete search history.

(56) References Cited

U.S. PATENT DOCUMENTS

| | | |
|---|---|---|
| 4,079,349 A | 3/1978 | Dorfeld |
| 4,746,896 A | 5/1988 | Mcquaid et al. |
| 6,077,357 A * | 6/2000 | Rossman ............ C23C 16/4585 118/723 R |
| 6,097,276 A | 8/2000 | Van Den Broek et al. |
| 6,236,555 B1 * | 5/2001 | Leeser ................ H01L 21/6833 279/128 |
| 6,847,014 B1 * | 1/2005 | Benjamin ......... H01L 21/67248 219/444.1 |

(Continued)

FOREIGN PATENT DOCUMENTS

GB    1109008 A  *  4/1968  ........... H01B 7/0063

OTHER PUBLICATIONS

"Test Structure and Software for Measuring Thin Film TCR." DS15063; 2003 Reedholm Instruments, Co.; www.reedholm.com; pp. 1-10.

*Primary Examiner* — Ibrahime A Abraham
*Assistant Examiner* — Gyounghyun Bae

(57) ABSTRACT

A substrate support for supporting a substrate in a substrate processing system includes a plurality of thermal elements. The thermal elements are arranged in one or more thermal zones, and each of the thermal zones includes at least one of the thermal elements. Each of the thermal elements includes a first resistive material having a positive thermal coefficient of resistance and a second resistive material having a negative thermal coefficient of resistance. The second resistive material is electrically connected to the first resistive material. At least one of the first resistive material and the second resistive material of each of the thermal elements is electrically connected to a power supply to receive power, and each of the thermal elements heats a respective one of the thermal zones based on the received power. At least one ceramic layer is arranged adjacent to the thermal elements.

14 Claims, 5 Drawing Sheets

(56) References Cited

U.S. PATENT DOCUMENTS

| | | | | |
|---|---|---|---|---|
| 6,921,724 B2* | 7/2005 | Kamp | | H01L 21/31116 |
| | | | | 156/345.52 |
| 6,958,463 B1* | 10/2005 | Kochman | | H05B 3/56 |
| | | | | 219/494 |
| 7,049,557 B2* | 5/2006 | DeAngelis | | H05B 1/0294 |
| | | | | 219/212 |
| 7,064,299 B2* | 6/2006 | Green | | H05B 3/347 |
| | | | | 219/515 |
| 7,478,869 B2* | 1/2009 | Lazanja | | B60N 2/5635 |
| | | | | 297/180.13 |
| 7,777,555 B2* | 8/2010 | Liao | | G05F 3/245 |
| | | | | 327/513 |
| 8,076,980 B2* | 12/2011 | Liu | | H03K 3/011 |
| | | | | 331/176 |
| 8,193,859 B1* | 6/2012 | Hietala | | H03G 3/3042 |
| | | | | 330/140 |
| 8,383,997 B2* | 2/2013 | Keite-Telgenbuscher | | |
| | | | | C09J 7/38 |
| | | | | 219/546 |
| 8,529,729 B2* | 9/2013 | Stevenson | | H01L 21/67248 |
| | | | | 156/345.37 |
| 8,680,441 B2 | 3/2014 | Singh | | |
| 9,147,581 B2 | 9/2015 | Guha | | |
| 9,165,979 B2* | 10/2015 | Tran | | B82Y 10/00 |
| 9,608,192 B2* | 3/2017 | Zou | | G10K 9/122 |
| 9,805,849 B2* | 10/2017 | Yuan | | H01C 7/06 |
| 2003/0189037 A1* | 10/2003 | Kochman | | H05B 3/342 |
| | | | | 219/549 |
| 2005/0230822 A1* | 10/2005 | Tran | | G11C 13/02 |
| | | | | 257/735 |
| 2005/0231855 A1* | 10/2005 | Tran | | G11B 9/14 |
| | | | | 360/324.1 |
| 2012/0299175 A1* | 11/2012 | Tran | | B82Y 10/00 |
| | | | | 257/712 |
| 2016/0013014 A1* | 1/2016 | Kagawa | | H01J 37/3171 |
| | | | | 250/396 R |
| 2016/0372352 A1* | 12/2016 | Wu | | H01L 21/67248 |
| 2016/0372355 A1* | 12/2016 | Zhang | | H01L 21/6831 |

* cited by examiner

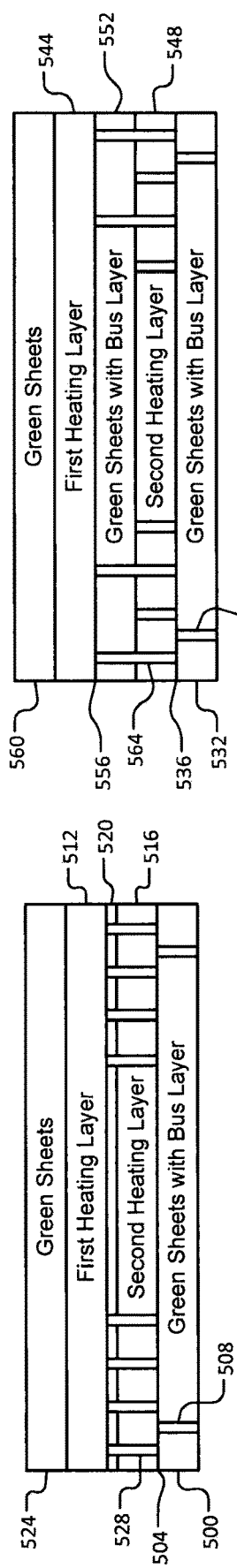
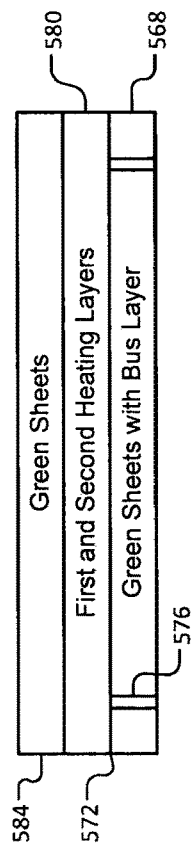
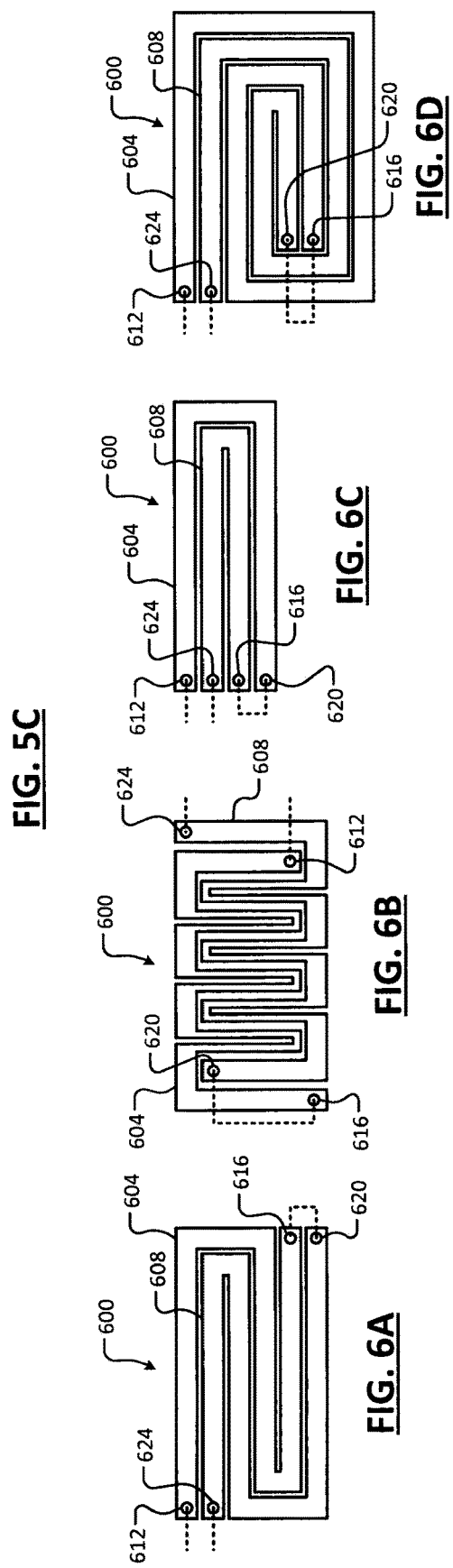

MATCHED TCR JOULE HEATER DESIGNS FOR ELECTROSTATIC CHUCKS

CROSS-REFERENCE TO RELATED APPLICATIONS

This application claims the benefit of U.S. Provisional Application No. 62/258,825, filed on Nov. 23, 2015. The entire disclosures of the applications referenced above are incorporated herein by reference.

FIELD

The present disclosure relates to substrate processing systems, and more particularly to systems and methods for controlling the temperature of a substrate support in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, a chemical vapor deposition (CVD), atomic layer deposition (ALD), and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

During process steps, temperatures of various components of the system, and the substrate itself, may vary. These temperature variations may have undesirable effects on the resulting substrates (such as defects or non-uniform critical dimensions). Accordingly, substrate processing systems may attempt to control temperatures of various components and the substrates during processing.

SUMMARY

A substrate support for supporting a substrate in a substrate processing system includes a plurality of thermal elements. The thermal elements are arranged in one or more thermal zones, and each of the thermal zones includes at least one of the thermal elements. Each of the thermal elements includes a first resistive material having a positive thermal coefficient of resistance and a second resistive material having a negative thermal coefficient of resistance. The second resistive material is electrically connected to the first material. At least one of the first resistive material and the second resistive material of each of the thermal elements is electrically connected to a power supply to receive power, and each of the thermal elements heats a respective one of the thermal zones based on the received power. At least one ceramic layer is arranged adjacent to the thermal elements.

A method of forming a substrate support in a substrate processing system includes forming at least one ceramic layer and arranging a plurality of thermal elements adjacent to the ceramic layer. The thermal elements are arranged to correspond to one or more thermal zones, and each of the thermal zones includes at least one of the thermal elements. Each of the thermal elements includes a first resistive material having a positive thermal coefficient of resistance and a second resistive material having a negative thermal coefficient of resistance. The second resistive material is electrically connected to the first material. At least one of the first resistive material and the second resistive material of each of the thermal elements is electrically connected to a power supply to receive power. Each of the thermal elements heats a respective one of the thermal zones based on the received power.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 5A, 5B, and 5C show example arrangements of heating layers including a first material having a first temperature coefficient of resistance (TCR) and a second material having a second TCR according to the principles of the present disclosure; and FIGS. 6A, 6B, 6C, and 6D show configurations of a single heating layer including both a first heating material and a second heating material according to the principles of the present disclosure.

In the drawings, reference numbers may be reused to identify similar and/or identical elements.

DETAILED DESCRIPTION

Figure 1:
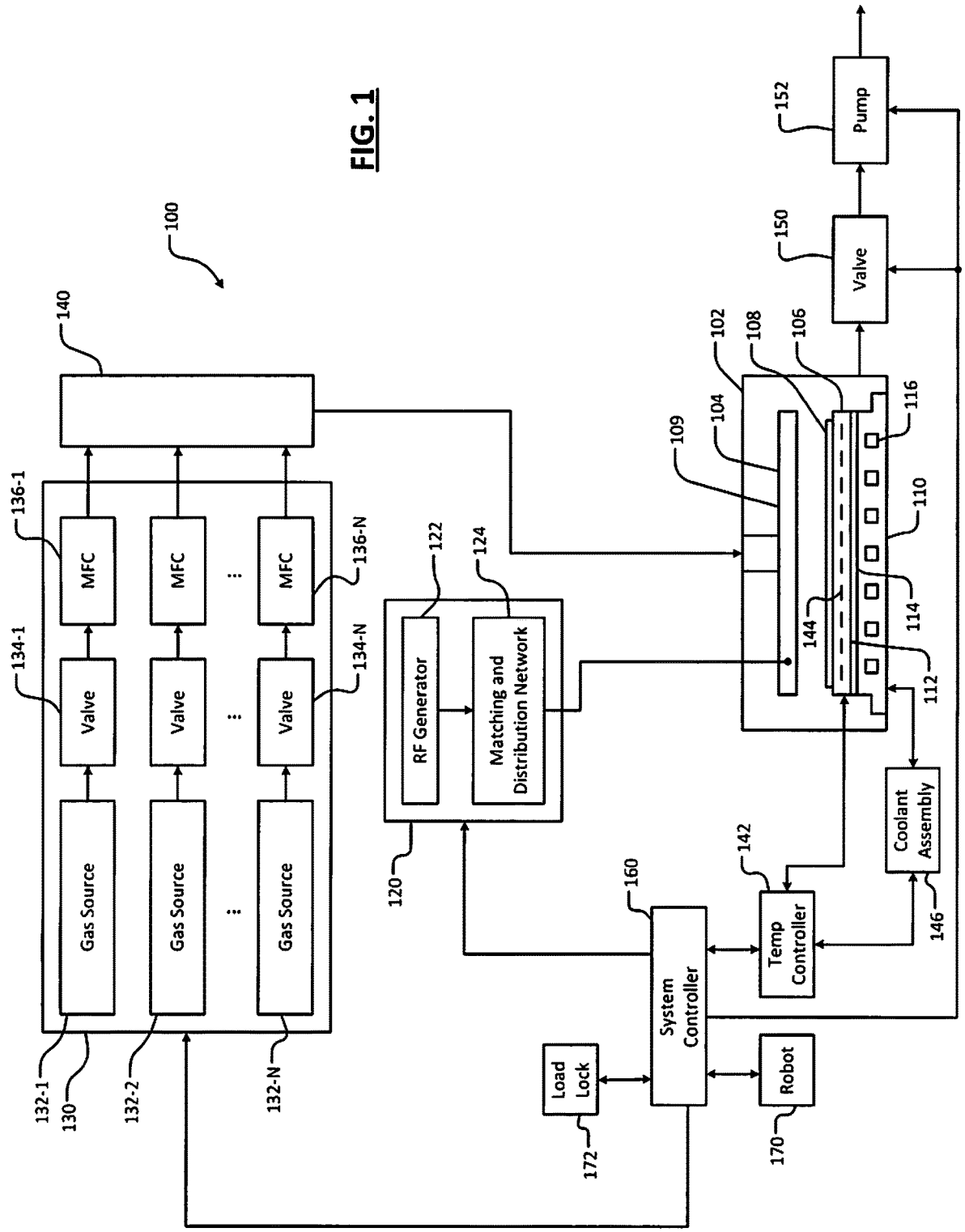
FIG. 1 is a functional block diagram of an example substrate processing system including a substrate support according to the principles of the present disclosure.

In a substrate processing system, temperatures of a substrate support, such as an electrostatic chuck (ESC), may be controlled during process steps. For example, different processes and respective steps may require that a substrate is maintained at the same or different temperatures. A contact surface temperature of the substrate support may be controlled to maintain the substrate at desired temperatures. For example only, the substrate support may include a heating plate (e.g., a ceramic heating plate). The substrate may be arranged on the heating plate. Accordingly, the temperature of the heating plate is controlled to achieve the desired temperatures of the substrate.

The temperature of the heating plate may be controlled by selectively providing current to a plurality of heating elements, which may be implemented using resistive materials embedded within the heating plate. In other words, the heating plate implements resistive (i.e., joule) heating. The heating elements may be arranged within a plurality of zones of the substrate support (e.g., a multi-zone substrate support). For example only, the substrate support may include 2, 3, 4, or 100 or more zones. Each zone may include one or more heating elements.

Resistive materials may have an associated temperature coefficient of resistance (TCR), which corresponds to an increased resistance (for positive TCR materials) or a decreased resistance (for negative TCR materials) as temperature increases. Accordingly, the power provided to the heating elements to control the temperature of the substrate support varies with temperature, causing variations in power output, temperature control efficiency and accuracy, etc. For example only, a material having a TCR of 0.3% per ° C. experiences a 60% change in resistance at from 0° C. to 200° C.

Systems and methods according to the present disclosure implement pairs of matched resistive heating elements having complementary positive and negative TCRs. For example, each heating element includes a first material having a positive TCR and a second material having a negative TCR. For example only, materials having a positive TCR include, but are not limited to, highly-doped platinum, tungsten ruthenium in oxides, etc. and materials having a negative TCR include, but are not limited to, semiconductors, low percent doped metals in oxides, etc. Accordingly, as the temperature of the respective zone of the substrate support varies, the resistance of the heating element including the matched positive and negative TCR materials remains substantially constant and/or changes at lower rates. In some examples, the first material and the second material are connected in series. In other examples, the first material and the second material are connected in parallel. The first material and the second material may be aligned vertically in different planes of the heating plate. In some examples, the first and second materials are spaced apart in different layers and another layer (e.g., a dielectric layer, a bus layer, etc.) is arranged between the first and second materials. In other examples, the first material and the second material may be coplanar (e.g., interwoven in a same plane of the heating plate).

Referring now to FIG. 1, an example substrate processing system 100 for performing etching using RF plasma is shown. The substrate processing system 100 includes a processing chamber 102 that encloses other components of the substrate processing system 100 and contains the RF plasma. The substrate processing system 100 includes an upper electrode 104 and a substrate support 106, such as an electrostatic chuck (ESC). During operation, a substrate 108 is arranged on the substrate support 106.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements (e.g., thermal control elements, or TCEs) 144 arranged in the heating plate 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Each of the heating elements 144 according to the principles of the present disclosure includes a first material having a positive TCR and a second material having a negative TCR as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160.

Figure 2A:
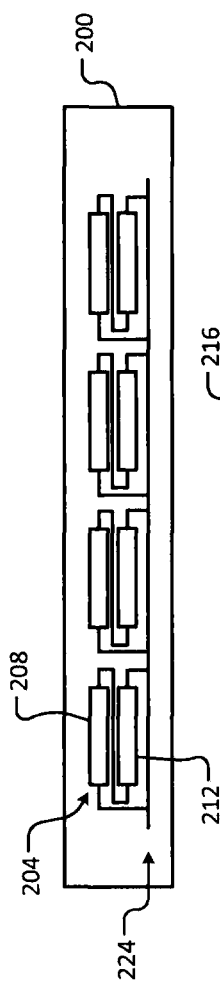
FIGS. 2A and 2B show an example heating plate including a plurality of heating elements in a side view and a top plan view, respectively, according to the principles of the present disclosure.
Figure 2B:
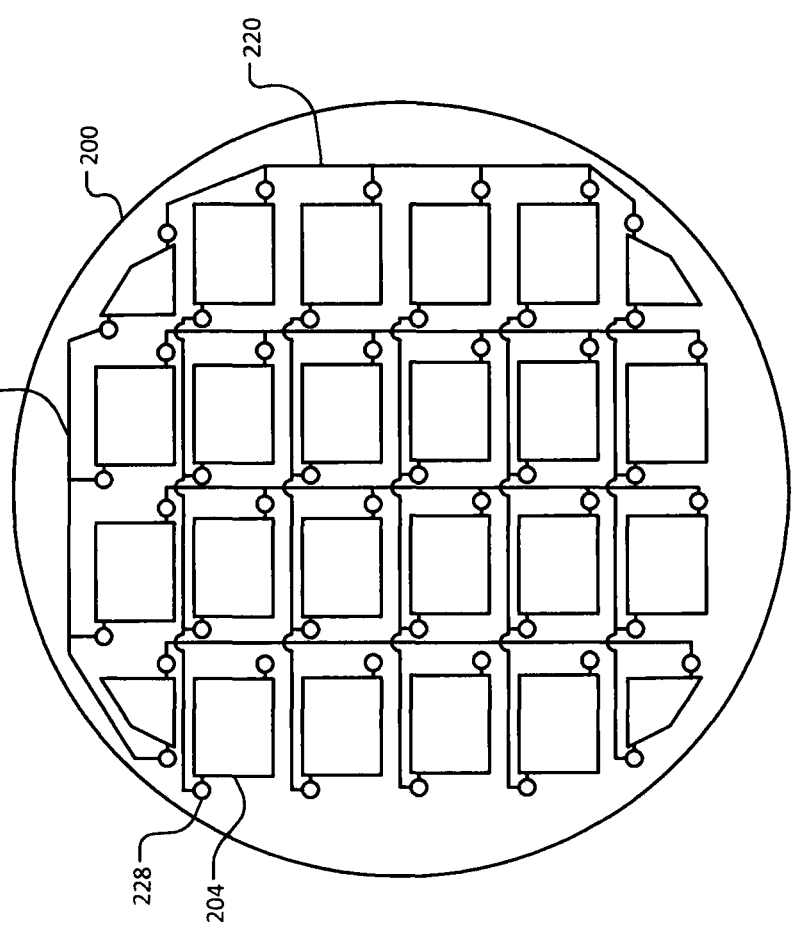

Referring now to FIGS. 2A and 2B, an example heating plate 200 (e.g., a ceramic heating plate) including a plurality of heating elements 204 is shown in a side cross-sectional view and a top plan view, respectively. Each of the heating elements 204 includes a first material 208 and a second material 212. The first material 208 may have a positive TCR while the second material 212 may have a negative TCR, or vice versa. Respective absolute values of the TCRs of the plurality of heating elements 204 may be the same or different. In other words, the first material 208 of one of the heating elements 204 may have a first positive TCR while the first material 208 of another one of the heating elements 204 may have the same first positive TCR or a second, different positive TCR. The first material 208 and the second material 212 may be spaced apart as shown, with a layer arranged therebetween. In some examples, a dielectric layer, a bus layer, etc. is arranged therebetween as described in more detail below. The heating elements 204 may be completely or partially encapsulated by one or more ceramic layers of the heating plate 200.

Although the heating elements 204 are described herein as being arranged within ceramic layers, in some embodiments the heating elements 204 may be formed in a metallized layer that is deposited on a bottom surface of a ceramic layer (e.g., either prior to or subsequent to the respective ceramic layer being fired). For example only, the metallized layer may comprise tungsten, palladium, silver, etc. to act as a heating layer. In some examples, the metallized layer may be deposited via PVD, electroless deposition, electroplating, etc. prior to the firing of the ceramic layer. In other examples, the metallized layer may be deposited via screen-printing prior to the firing of the ceramic layer.

Although as shown the first material 208 is arranged directly above the second material 212 in a vertical direction, this illustration is for example only and other arrangements may be used as described below in more detail. For example, the first material 208 and the second material 212 may be offset in a lateral direction such that the first material 208 only partially overlaps the second material 212, partially overlaps the second material 212 of another heating element, etc. In some examples, the first material 208 may be completely offset from the second material 212 in a lateral direction (i.e., the first material 208 does not overlap the second material 212 of the same heating element), and the first material 208 and the second material 212 may be coplanar.

Each of the heating elements 204 may correspond to a different zone of the heating plate 200, or multiple heating elements 204 may correspond to a single zone. Although shown arranged in a rectangular grid, in other examples the heating elements 204 may be arranged in other configurations such as concentric rings, a hexagonal grid, etc.

Each of the heating elements 204 is connected to power supply lines 216 and/or power return lines 220 as shown schematically. The connections of the power supply lines 216 and the power return lines 220 are shown for example only, and other arrangements may be used. For example, a bus layer 224 may be arranged below the heating elements 204 including the power supply lines 216 and the power return lines 220. Connections between the bus layer 224 and the heating elements 204 are provided using respective vias 228. In the present example, no two heating elements 204 share a same pair of the power supply lines 216 and the power return lines 220. Accordingly, by selectively switching respective power supply lines 216 and power return lines 220, each of the heating elements 204 can be individually provided with power independently of others of the heating elements 204. In some implementations, to prevent crosstalk between different heating elements 204, a rectifier (e.g. a diode, FIG. 3) may be serially connected between each of the heating elements 204 and the power supply lines 216, or between each of the heating elements 204 and the power return lines 220. The rectifier can be arranged within the heating plate (e.g., in the bus layer 224) or any suitable location. In other implementations, other current blocking elements (e.g., solid state switches) may be used to prevent crosstalk.

In examples, the first material 208 and the second material 212 may each include composites of various insulators and conductors. For example only, the first material 208 may include $Al_2O_3$, $SiO_2$, $Si_3N_4$, AlN, Al, Cu, Mo, W, Au, Ag, Pt, Pd, C, $MoSi_2$, WC, SiC, and mixtures thereof resulting in a positive TCR. Conversely, the second material 212 may include Si or Ge (e.g., applied in powder form as a screen-printed ink), metal oxides including, but not limited to, spinel phase manganates, cobalt oxides, nickel oxides, and mixtures thereof (e.g., $Fe_2O_3$ and Ti, NoO and Li, etc.), Rh, Ru, Pt, W, and other known low-temperature semiconducting metal oxides. Other materials that may suitable in some implementations include C, Ni, Cr, and Co. The materials 208 and 212 may be formed by combining powders (for example only, having particle sizes from 0.2 to 10 microns) of an insulator and a conductor with a suitable liquid (e.g. methanol, ethanol, acetone, isopropyl alcohol, water, mineral oil, or a mixture thereof) into a slurry, and sintering the slurry.

The heating plate 200 may be formed from ceramic using various methods. For example, a mixture of ceramic powder, binder and liquid may be pressed into ceramic layer sheets (which may be referred to as "green sheets"). The green sheets are dried and holes are punched in the green sheets to form vias (e.g., corresponding to the vias 228). The vias are filled with conductive material (e.g., a slurry of conducting powder). The power supply lines 216 and the power return lines 220 corresponding to a first bus or routing layer are formed on the green sheets. For example only, the power supply lines 216 and the power return lines 220 are formed on the ceramic green sheets by screen printing a slurry of conducting powder (e.g. W, WC, doped SiC, $MoSi_2$, etc.), pressing a precut metal foil, spraying a slurry of conducting powder, and/or other suitable techniques.

The heating elements 204 are then formed on the ceramic green sheets. For example only, the heating elements 204 may be formed by screen printing or spraying a slurry of insulator and conductor powders in one or more heating layer green sheets (e.g., first heating layer green sheets corresponding to a first material and second heating layer green sheets corresponding to a second material). For example, the first heating layer green sheets may be deposited on the ceramic green sheets, an intermediate layer (e.g., another ceramic green sheet layer, a dielectric layer, and/or a second bus layer) may be formed on the first heating layer green sheets. Additional vias may be formed through the first heating layer green sheets to connect the first bus layer and/or the first heating layer green sheets to the second bus layer. The second heating layer green sheets are then formed on the intermediate layer.

The ceramic green sheets and the heating layer green sheets are aligned and then bonded together by sintering. For example, in one example, the ceramic green sheets and the first heating layer green sheets may be aligned and bonded together prior to forming the intermediate layer. The intermediate layer is then formed, aligned, and bonded to the first heating layer, and the second heating layer green sheets are formed, aligned, and bonded to the intermediate layer. In other examples, the ceramic green sheets, the first heating layer green sheets, the intermediate layer, and the second heating layer green sheets are aligned and bonded together in a same process step. Other ceramic green sheets may be formed on the heating layer green sheets as described above to form a substantially contiguous ceramic layer completely encapsulating the first and second heating materials of the heating layer.

Figure 3:
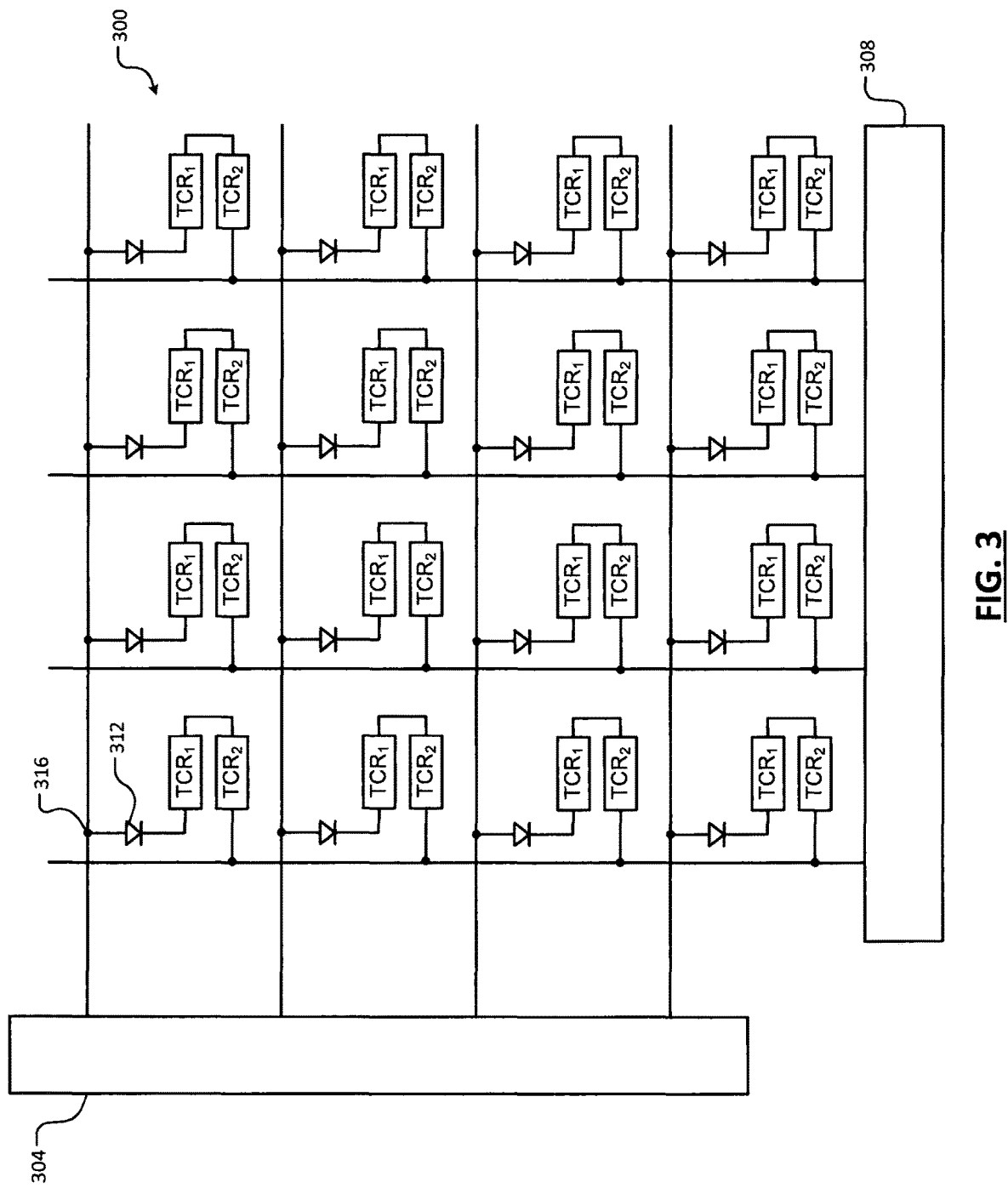
FIG. 3 illustrates example wiring of a plurality of heating elements according to the principles of the present disclosure.

Referring now to FIG. 3, example wiring of a plurality of heating elements 300 is shown schematically. In this example, a first material TCR1 (e.g., having a positive TCR) and a second material TCR2 (e.g., having a negative TCR) are connected in series. For example, a first end of the first material TCR1 is connected to a power supply bus 304 and a second end of the first material TCR1 is connected to a first end of the second material TCR2. A second end of the second material TCR2 is connected to a power return bus 308. In some embodiments, a diode 312 (e.g., functioning as a rectifier as described above in FIGS. 2A and 2B) may be serially connected between each of the heating elements 300 and the power supply bus 304. As shown in FIG. 3, nodes 316 indicate a connection between intersecting wires, and intersecting wires that do not include the node 316 are not connected together.

Figure 4:
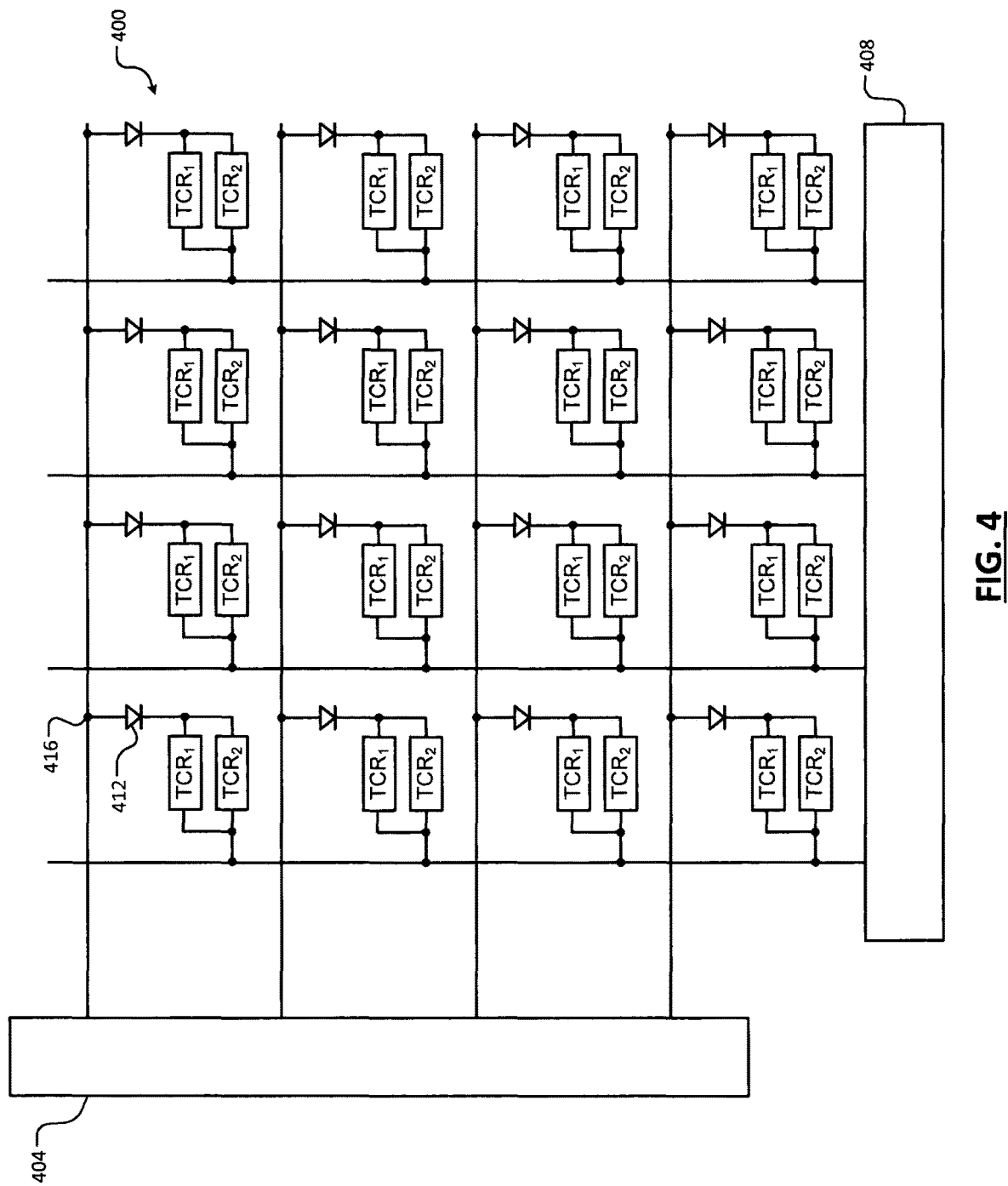
FIG. 4 illustrates another example wiring of a plurality of heating elements according to the principles of the present disclosure.

Referring now to FIG. 4, another example wiring of a plurality of heating elements 400 is shown schematically. In this example, a first material $TCR_1$ (e.g., having a positive TCR) and a second material $TCR_2$ (e.g., having a negative TCR) are connected in parallel. For example, respective first ends of the first material $TCR_1$ and the second material $TCR_2$ are connected to a power supply bus 404 and respective second ends of the first material $TCR_1$ and the second material $TCR_2$ are connected to a power return bus 408. In some embodiments, a diode 412 may be serially connected between each of the heating elements 400 and the power supply bus 404. As shown in FIG. 4, nodes 416 indicate a connection between intersecting wires, and intersecting wires that do not include the node 416 are not connected together.

FIGS. 5A, 5B, and 5C show example arrangements of heating layers corresponding to a first material having a first (e.g., positive) TCR and a second material having a second (e.g., negative) TCR. As shown in an example in FIG. 5A, a layer 500 corresponds to a first ceramic layer of green sheets, which may include a bus layer 504 formed thereon. Vias 508 are formed in the layer 500 to connect the bus layer 504 to a power supply and a power return. Green sheets including a first heating layer 512 and a second heating layer 516 are formed on the layer 500. A dielectric layer 520 may be formed between the first heating layer 512 and the second heating layer 516. A layer 524 corresponding to a second ceramic layer of green sheets may be formed on the first heating layer 512. A plurality of vias 528 formed through the second heating layer 516, the dielectric layer 520, and/or the first heating layer 512 connect the bus layer 504 to the first heating layer 512 and the second heating layer 516 according to a desired configuration (e.g., whether the first heating layer 512 and the second heating layer 516 in respective heating elements are connected in series, in parallel, etc.).

As shown in another example in FIG. 5B, a layer 532 corresponds to a first ceramic layer of green sheets, which may include a bus layer 536 formed thereon. Vias 540 are formed in the layer 532 to connect the bus layer 536 to a power supply and a power return. Green sheets including a first heating layer 544 and a second heating layer 548 are formed on a layer 552 and the layer 532. The layer 552 corresponds to a second ceramic layer of green sheets, which may include a bus layer 556 formed thereon. A layer 560 corresponding to a third ceramic layer of green sheets may be formed on the first heating layer 544. A plurality of vias 564 formed through the second heating layer 548, the layer 552, and/or the first heating layer 544 connect the bus layer 536 to the first heating layer 544, the second heating layer 548, and the bus layer 556 according to a desired configuration (e.g., whether the first heating layer 544 and the second heating layer 548 in respective heating elements are connected in series, in parallel, etc.).

As shown in an example in FIG. 5C, a layer 568 corresponds to a first ceramic layer of green sheets, which may include a bus layer 572 formed thereon. Vias 576 are formed in the layer 568 to connect the bus layer 572 to a power supply and a power return. Green sheets including a first heating layer 580 with both a first heating material and a second heating material are formed on the layer 568. In other words, the same heating layer 580 includes both a positive TCR material and a negative TCR material (i.e., the first heating material and the second heating material are substantially coplanar) in contrast to arranging the first heating material and the second heating material in different layers as shown in FIGS. 5B and 5C. A layer 584 corresponding to a second ceramic layer of green sheets may be formed on the first heating layer heating layer 580.

Referring now to FIGS. 6A, 6B, 6C, and 6D show example configurations of a single heating layer 600 including both a first heating material 604 and a second heating material 608 as described in FIG. 5C. The first heating material 604 and the second heating material 608 are interwoven in the same heating layer 600 (e.g., in the same plane). In FIG. 6A, the first heating material 604 and the second heating material 608 are interwoven in an "S"-shape. In FIG. 6B, the first heating material 604 and the second heating material 608 include interlocking alternating fingers. In FIG. 6C, the first heating material 604 and the second heating material 608 are interwoven in a "U"-shape. In FIG. 6D, the first heating material 604 and the second heating material 608 are interwoven in a spiral shape.

As shown in each of FIGS. 6A, 6B, 6C, and 6D, the first heating material 604 and the second heating material 608 are connected together in a serial configuration. However, in other examples, the first heating material 604 and the second heating material 608 may be connected together in a parallel configuration. Power is provided to a first end of the first heating material 604 using a via 612. A second end of the first heating material 604 is connected to a first end of the second heating material 608 using respective vias 616 and 620. A second end of the second heating material 608 is connected to a power return using via 624.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support for supporting a substrate in a substrate processing system, the substrate support comprising:
   a plurality of thermal elements, wherein the thermal elements are arranged in one or more thermal zones, and wherein each of the thermal zones includes at least one of the thermal elements,
   wherein each of the thermal elements includes
     a first resistive material having a positive thermal coefficient of resistance (TCR), and
     a second resistive material having a negative TCR, wherein the second resistive material is electrically connected to the first resistive material, and
   wherein at least one of the first resistive material and the second resistive material of each of the thermal elements is electrically connected to a power supply to receive power, and wherein each of the thermal elements heats a respective one of the thermal zones based on the received power; and at least one ceramic layer arranged adjacent to the thermal elements.

2. The substrate support of claim 1, wherein the at least one ceramic layer includes a first ceramic layer and a second ceramic layer, wherein the thermal elements are arranged in a heating layer formed on the first ceramic layer, wherein the second ceramic layer is formed on the heating layer.

3. The substrate support of claim 2, wherein the heating layer corresponds to a metallized layer deposited on a surface of the at least one ceramic layer.

4. The substrate support of claim 1, wherein respective absolute values of the positive TCR and the negative TCR are equal.

5. The substrate support of claim 1, wherein a sum of the positive TCR and the negative TCR is zero.

6. The substrate support of claim 1, wherein the first resistive material and the second resistive material are electrically connected together in series.

7. The substrate support of claim 1, wherein the first resistive material and the second resistive material are electrically connected together in parallel.

8. The substrate support of claim 1, wherein the first resistive material is arranged above the second resistive material.

9. The substrate support of claim 8, wherein the first resistive material is arranged directly above the second resistive material.

10. The substrate support of claim 8, wherein the first resistive material is laterally offset from the second resistive material.

11. The substrate support claim 1, wherein the first resistive material and the second resistive material are coplanar.

12. The substrate support of claim 11, wherein the first resistive material and the second resistive material are interwoven.

13. The substrate support of claim 12, wherein the first resistive material and the second resistive material are interwoven to form at least one of an "S"-shape, a spiral shape, and a "U"-shape.

14. The substrate support of claim 12, wherein the first resistive material and the second resistive material include alternately interlocking fingers.

* * * * *